(12) United States Patent
Yang

(10) Patent No.: US 9,094,046 B2
(45) Date of Patent: Jul. 28, 2015

(54) SYSTEMS AND METHODS FOR VARIABLE SECTOR COUNT SPREADING AND DE-SPREADING

(71) Applicant: LSI Corporation, San Jose, CA (US)

(72) Inventor: Shaohua Yang, San Jose, CA (US)

(73) Assignee: LSI Corporation, San Jose, CA (US)

( * ) Notice: Subject to any disclaimer, the term of this patent is extended or adjusted under 35 U.S.C. 154(b) by 14 days.

(21) Appl. No.: 14/025,468

(22) Filed: Sep. 12, 2013

(65) Prior Publication Data

US 2015/0062738 A1   Mar. 5, 2015

Related U.S. Application Data

(60) Provisional application No. 61/872,882, filed on Sep. 3, 2013.

(51) Int. Cl.
| | |
|---|---|
| *G11B 5/09* | (2006.01) |
| *H03M 13/27* | (2006.01) |
| *G06F 11/10* | (2006.01) |
| *G11B 20/18* | (2006.01) |
| *G11B 20/12* | (2006.01) |
| *H03M 13/05* | (2006.01) |
| *H03M 13/11* | (2006.01) |

(52) U.S. Cl.
CPC ........... *H03M 13/27* (2013.01); *G06F 11/1076* (2013.01); *G11B 20/1217* (2013.01); *G11B 20/1866* (2013.01); *G11B 20/1889* (2013.01); *H03M 13/05* (2013.01); *H03M 13/1102* (2013.01)

(58) Field of Classification Search
CPC .............. G11B 7/005; G11B 20/10046; G11B 20/10425; G11B 20/10212; G11B 20/1866; G11B 5/012; G11B 5/016; G11B 5/09; G11B 20/1217; G11B 20/18; H03M 13/111; H03M 13/1108; H03M 13/1128; H03M 13/31; H03M 13/2703; H03M 13/2764; H03M 13/1105; H03M 13/1102; H03M 13/05; H03M 13/27
USPC .............. 360/39, 48, 53, 66, 46, 40; 714/758, 714/746, 800, 752, 784, 755, 795, 794, 774, 714/764, 756

See application file for complete search history.

(56) References Cited

U.S. PATENT DOCUMENTS

| | | | |
|---|---|---|---|
| 5,222,069 | A | 6/1993 | Chevalley |
| 5,392,299 | A * | 2/1995 | Rhines et al. ................. 714/756 |
| 5,731,922 | A | 3/1998 | Yamasaki |
| 5,938,790 | A | 8/1999 | Marrow |
| 6,029,264 | A | 2/2000 | Kobayashi |
| 6,272,659 | B1 | 8/2001 | Zook |

(Continued)

FOREIGN PATENT DOCUMENTS

JP          06046406          2/1994

OTHER PUBLICATIONS

Kang et al., "A Two-Stage Iterative Decoding of LDPC Codes for Lowering Error Floors", IEEE GLOBECOM Proceedings, 1088-1091 (2008).

(Continued)

*Primary Examiner* — Ali Neyzari
(74) *Attorney, Agent, or Firm* — Hamilton DeSanctis & Cha

(57) ABSTRACT

Systems and method relating generally to data processing, and more particularly to systems and methods for encoding and decoding information.

20 Claims, 7 Drawing Sheets

(56) References Cited

U.S. PATENT DOCUMENTS

| | | |
|---|---|---|
| 6,438,724 B1 | 8/2002 | Cox |
| 6,446,234 B1 | 9/2002 | Cox |
| 6,493,846 B1 | 12/2002 | Kondo |
| 6,694,477 B1 | 2/2004 | Lee |
| 6,810,094 B1 | 10/2004 | Lu |
| 6,847,601 B2 | 1/2005 | Kanai |
| 7,178,086 B2 | 2/2007 | Hassner |
| 7,395,491 B2 | 7/2008 | Chen |
| 7,685,497 B2 | 3/2010 | Kons |
| 8,230,292 B2 | 7/2012 | Fujiwara |
| 8,683,309 B2 * | 3/2014 | Zhang et al. ............ 714/800 |
| 8,724,243 B1 * | 5/2014 | Karabed et al. ............ 360/40 |
| 8,782,487 B2 * | 7/2014 | Yang et al. ............ 714/758 |
| 8,782,488 B2 * | 7/2014 | Yang et al. ............ 714/758 |
| 8,949,704 B2 * | 2/2015 | Zhang et al. ............ 714/810 |
| 2005/0166132 A1 | 7/2005 | Shen et al. |
| 2007/0201632 A1 | 8/2007 | Ionescu |
| 2010/0042890 A1 | 2/2010 | Gunnam et al. |
| 2010/0287436 A1 | 11/2010 | Lastras-Montano |
| 2011/0109773 A1 | 5/2011 | Dekel |
| 2011/0161774 A1 | 6/2011 | Shin et al. |
| 2011/0164745 A1 | 7/2011 | Marzetta et al. |
| 2012/0005551 A1 | 1/2012 | Gunnam et al. |
| 2012/0288003 A1 | 11/2012 | Do et al. |
| 2013/0007570 A1 | 1/2013 | Seago |
| 2013/0024163 A1 | 1/2013 | Xia |
| 2013/0086446 A1 | 4/2013 | Yeung et al. |

OTHER PUBLICATIONS

Lin et al "An efficient VLSI Architecture for non binary LDPC decoders"—IEEE Transaction on Circuits and Systems II vol. 57, Issue 1 (Jan. 2010) pp. 51-55.

Perisa et al "Frequency Offset Estimation Based on Phase Offsets Between Sample Correlations" Dept. of Info. Tech. University of Ulm 2005.

U.S. Appl. No. 13/654,417, filed Oct. 18, 2012, Fan Zhang, Unpublished.

U.S. Appl. No. 13/766,857, filed Feb. 14, 2013, Shaohua Yang, Unpublished.

U.S. Appl. No. 13/707,898, filed Dec. 7, 2012, Razmik Karabed, Unpublished.

U.S. Appl. No. 13/426,722, filed Mar. 22, 2012, Fan Zhang, Unpublished.

U.S. Appl. No. 13/452,733, filed Apr. 20, 2012, Shaohua Yang, Unpublished.

U.S. Appl. No. 13/450,289, filed Apr. 18, 2012, Shaohua Yang, Unpublished.

U.S. Appl. No. 13/284,754, filed Oct. 28, 2011, Fan Zhang, Unpublished.

U.S. Appl. No. 13/363,751, filed Feb. 1, 2012, Lei Chen, Unpublished.

* cited by examiner

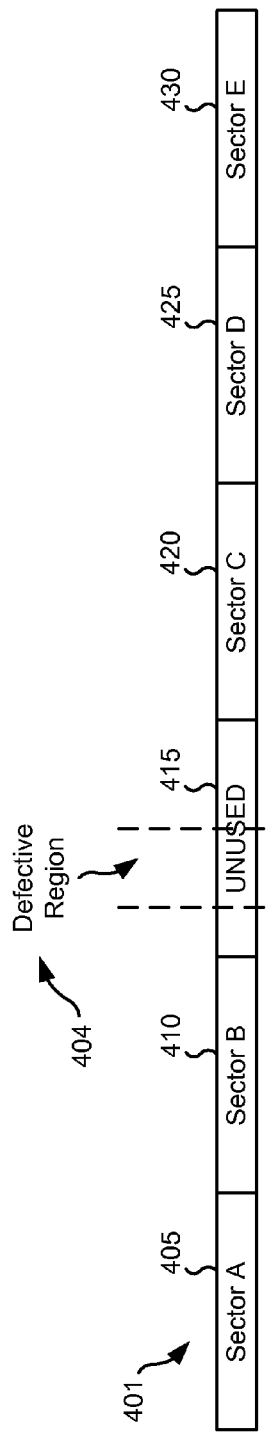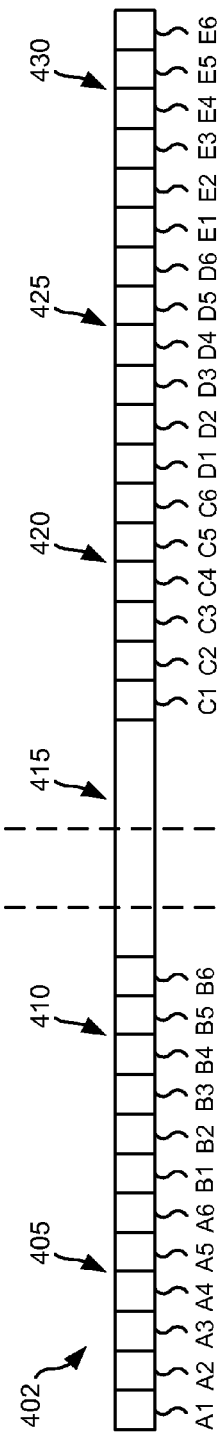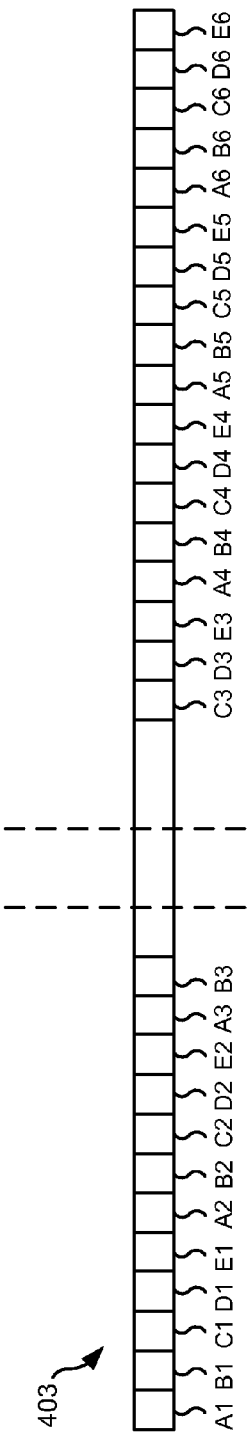

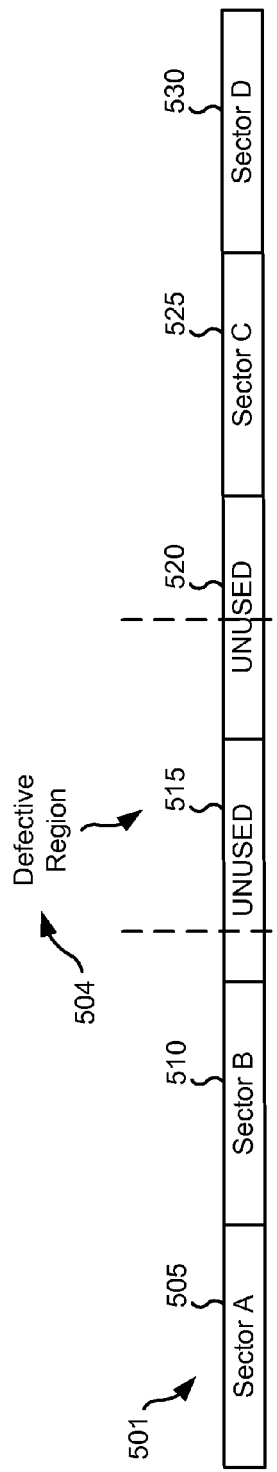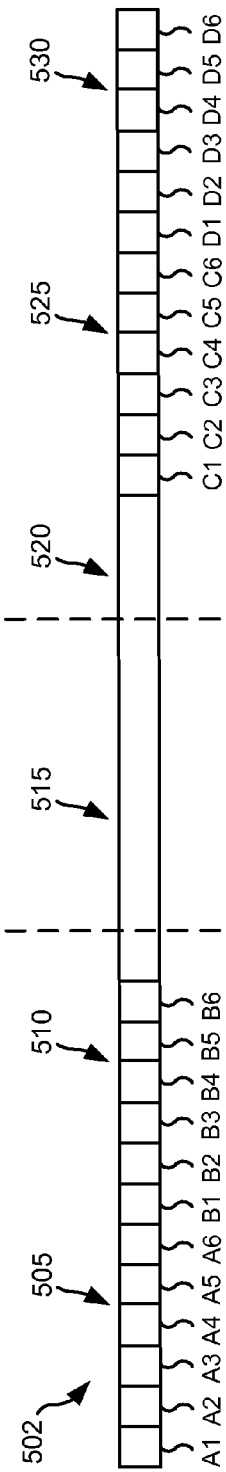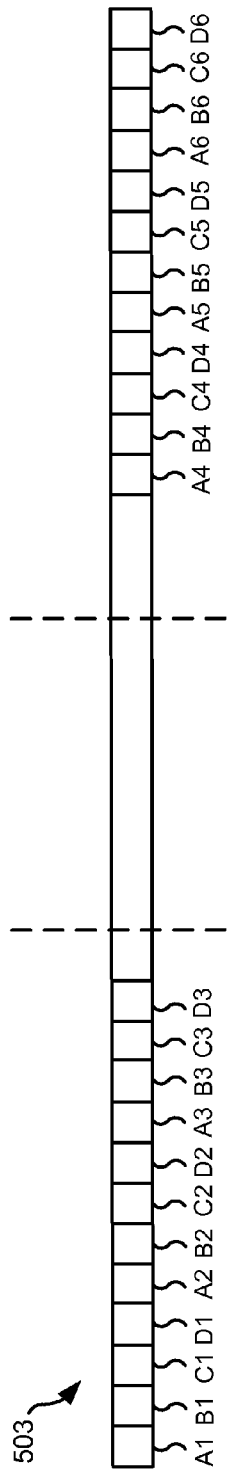

SYSTEMS AND METHODS FOR VARIABLE SECTOR COUNT SPREADING AND DE-SPREADING

CROSS REFERENCE TO RELATED APPLICATIONS

The present application claims priority to (is a non-provisional of) U.S. Pat. App. No. 61/872,882 entitled "Systems and Methods for Variable Sector Count Spreading and De-Spreading", and filed Sep. 3, 2013 by Yang. The entirety of the aforementioned provisional patent application is incorporated herein by reference for all purposes.

FIELD OF THE INVENTION

Systems and methods relating generally to data processing, and more particularly to systems and methods for data spreading in a data transfer system.

BACKGROUND

Data transfers often include encoding of a data set to be transferred to yield an encoded data set, and subsequent decoding of the encoded data set to recover the original data set. In some cases, a number of encoded data sets are interleaved to spread out the impact of channel noise on data sets transferred via a channel. This spreading includes incorporating a defined number of encoded data sets into an overall data set where portions of the encoded data sets are intermixed. In cases where the channel includes a medium where the data is to be written, the process of intermixing multiple data sets to yield the overall data set includes lengthening the overall data set to account for defective regions on the storage medium. As such, the area on the storage medium used to store an overall data set varies depending upon the area of defects on the storage medium to which data is to be written on the storage. Such variation results in a situation where tracks in a given zone on the storage medium may exhibit different interleaved sector formatting, and/or where a growing defect is identified, the formatting much change for the region. Dealing with such situations can be computationally complex and thus expensive.

Hence, for at least the aforementioned reasons, there exists a need in the art for advanced systems and methods for data processing.

SUMMARY

Systems and methods relating generally to data processing, and more particularly to systems and methods for data spreading in a data transfer system.

Various embodiments of the present invention provide data processing systems that include a data encoding circuit. The data encoding circuit is operable to: select a number of sector sized encoded data sets for inclusion in an interleaved data set based upon an identified defect on a storage medium; and shuffle segments of the selected number of encoded data sets to yield the interleaved data set.

This summary provides only a general outline of some embodiments of the invention. The phrases "in one embodiment," "according to one embodiment," "in various embodiments", "in one or more embodiments", "in particular embodiments" and the like generally mean the particular feature, structure, or characteristic following the phrase is included in at least one embodiment of the present invention, and may be included in more than one embodiment of the present invention. Importantly, such phases do not necessarily refer to the same embodiment. Many other embodiments of the invention will become more fully apparent from the following detailed description, the appended claims and the accompanying drawings.

BRIEF DESCRIPTION OF THE FIGURES

A further understanding of the various embodiments of the present invention may be realized by reference to the figures which are described in remaining portions of the specification. In the figures, like reference numerals are used throughout several figures to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

FIGS. 4a-4c shows phases of data spreading in accordance with one or more embodiments of the present invention where the region on a storage medium to be written includes a defect smaller than the size of a sector;

FIGS. 5a-5c shows phases of data spreading in accordance with one or more embodiments of the present invention where the region on a storage medium to be written includes a defect smaller than the size of two sectors;

DETAILED DESCRIPTION OF SOME EMBODIMENTS

Systems and methods relating generally to data processing, and more particularly to systems and methods for data spreading in a data transfer system.

Various embodiments of the present invention provide data processing systems that include a data encoding circuit. The data encoding circuit is operable to: select a number of sector sized encoded data sets for inclusion in an interleaved data set based upon an identified defect on a storage medium; and shuffle segments of the selected number of encoded data sets to yield the interleaved data set. In some cases where the size of each of the encoded data sets is a sector size and a size of the identified defect on the storage medium is less than the sector size, the systems may further include a data write circuit operable to write the interleaved data set to the storage medium such that a sector sized region on the storage medium corresponding to the identified defect does not store any information corresponding to any of the encoded data sets. In other cases where the size of each of the encoded data sets is a sector size and a size of the identified defect on the storage medium is greater than the sector size and less than two times the sector size, the systems further include a data write circuit operable to write the interleaved data set to the storage medium such that a region of two times the sector size on the storage medium corresponding to the identified defect does not store any information corresponding to any of the encoded data sets.

In some instances of the aforementioned embodiments, a number of encoded data sets included in an interleaved data set varies as a function of a number of defects and the size of those defects on the storage medium. In various instances of the aforementioned embodiments, the systems further include a defect location determination circuit operable to indicate the identified defect on the storage medium based at least in part on a write address. In some cases, the size of each of the encoded data sets is a sector size, and the segments are one half or less of the sector size. In one or more instances of the aforementioned embodiments, the systems further include a data read circuit. The data read circuit is operable to: identify valid portions of data written to the storage medium based at least in part on the identified defect on a storage medium to yield a read data set; and de-shuffle the read data set to yield the encoded data sets.

Figure 1:
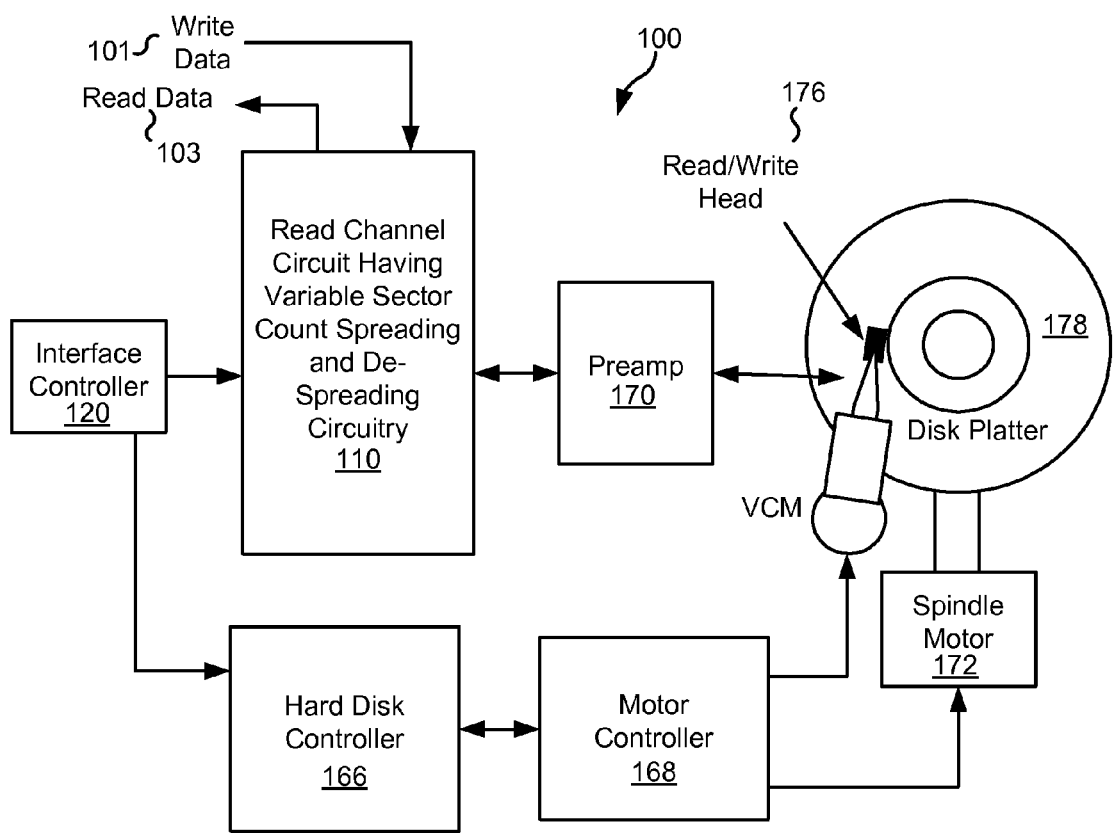
FIG. 1 shows a storage system including a read channel having variable sector count spreading and de-spreading circuitry in accordance with one or more embodiments of the present invention.

Turning to FIG. 1, a storage system 100 is shown that includes a read channel 110 having variable sector count spreading and de-spreading circuitry in accordance with one or more embodiments of the present invention. Storage system 100 may be, for example, a hard disk drive. Storage system 100 also includes a preamplifier 170, an interface controller 120, a hard disk controller 166, a motor controller 168, a spindle motor 172, a disk platter 178, and a read/write head 176. Interface controller 120 controls addressing and timing of data to/from disk platter 178, and interacts with a host controller (not shown). The data on disk platter 178 consists of groups of magnetic signals that may be detected by read/write head assembly 176 when the assembly is properly positioned over disk platter 178. In one embodiment, disk platter 178 includes magnetic signals recorded in accordance with either a longitudinal or a perpendicular recording scheme.

In a typical read operation, read/write head 176 is accurately positioned by motor controller 168 over a desired data track on disk platter 178. Motor controller 168 both positions read/write head 176 in relation to disk platter 178 and drives spindle motor 172 by moving read/write head assembly 176 to the proper data track on disk platter 178 under the direction of hard disk controller 166. Spindle motor 172 spins disk platter 178 at a determined spin rate (RPMs). Once read/write head 176 is positioned adjacent the proper data track, magnetic signals representing data on disk platter 178 are sensed by read/write head 176 as disk platter 178 is rotated by spindle motor 172. The sensed magnetic signals are provided as a continuous, minute analog signal representative of the magnetic data on disk platter 178. This minute analog signal is transferred from read/write head 176 to read channel circuit 110 via preamplifier 170. Preamplifier 170 is operable to amplify the minute analog signals accessed from disk platter 178. In turn, read channel circuit 110 decodes and digitizes the received analog signal to recreate the information originally written to disk platter 178. This data is provided as read data 103 to a receiving circuit. A write operation is substantially the opposite of the preceding read operation with write data 101 being provided to read channel circuit 110. This data is then encoded and written to disk platter 178.

In operation, data written to disk platter 178 is encoded with a number of the resulting encoded data sets being intermixed using sector spreading circuitry that yields an overall codeword using the same encoding and of consistent length. When the data is read back from disk platter 178, the received data set is processed by sector de-spreading circuitry that substantially reverses the process applied by the sector spreading circuitry. In some cases, the sector spreading and de-spreading may be done by a circuit similar to that discussed below in relation to FIG. 2, and/or may be performed consistent with the processes discussed below in relation to FIG. 6 and FIG. 7.

It should be noted that storage system 100 may be integrated into a larger storage system such as, for example, a RAID (redundant array of inexpensive disks or redundant array of independent disks) based storage system. Such a RAID storage system increases stability and reliability through redundancy, combining multiple disks as a logical unit. Data may be spread across a number of disks included in the RAID storage system according to a variety of algorithms and accessed by an operating system as if it were a single disk. For example, data may be mirrored to multiple disks in the RAID storage system, or may be sliced and distributed across multiple disks in a number of techniques. If a small number of disks in the RAID storage system fail or become unavailable, error correction techniques may be used to recreate the missing data based on the remaining portions of the data from the other disks in the RAID storage system. The disks in the RAID storage system may be, but are not limited to, individual storage systems such as storage system 100, and may be located in close proximity to each other or distributed more widely for increased security. In a write operation, write data is provided to a controller, which stores the write data across the disks, for example by mirroring or by striping the write data. In a read operation, the controller retrieves the data from the disks. The controller then yields the resulting read data as if the RAID storage system were a single disk.

A data decoder circuit used in relation to read channel circuit 110 may be, but is not limited to, a low density parity check (LDPC) decoder circuit as are known in the art. Such low density parity check technology is applicable to transmission of information over virtually any channel or storage of information on virtually any media. Transmission applications include, but are not limited to, optical fiber, radio frequency channels, wired or wireless local area networks, digital subscriber line technologies, wireless cellular, Ethernet over any medium such as copper or optical fiber, cable channels such as cable television, and Earth-satellite communications. Storage applications include, but are not limited to, hard disk drives, compact disks, digital video disks, magnetic tapes and memory devices such as DRAM, NAND flash, NOR flash, other non-volatile memories and solid state drives.

In addition, it should be noted that storage system 100 may be modified to include solid state memory that is used to store data in addition to the storage offered by disk platter 178. This solid state memory may be used in parallel to disk platter 178 to provide additional storage. In such a case, the solid state memory receives and provides information directly to read channel circuit 110. Alternatively, the solid state memory may be used as a cache where it offers faster access time than that offered by disk platted 178. In such a case, the solid state memory may be disposed between interface controller 120 and read channel circuit 110 where it operates as a pass through to disk platter 178 when requested data is not available in the solid state memory or when the solid state memory does not have sufficient storage to hold a newly written data set. Based upon the disclosure provided herein, one of ordinary skill in the art will recognize a variety of storage systems including both disk platter 178 and a solid state memory.

Figure 2:
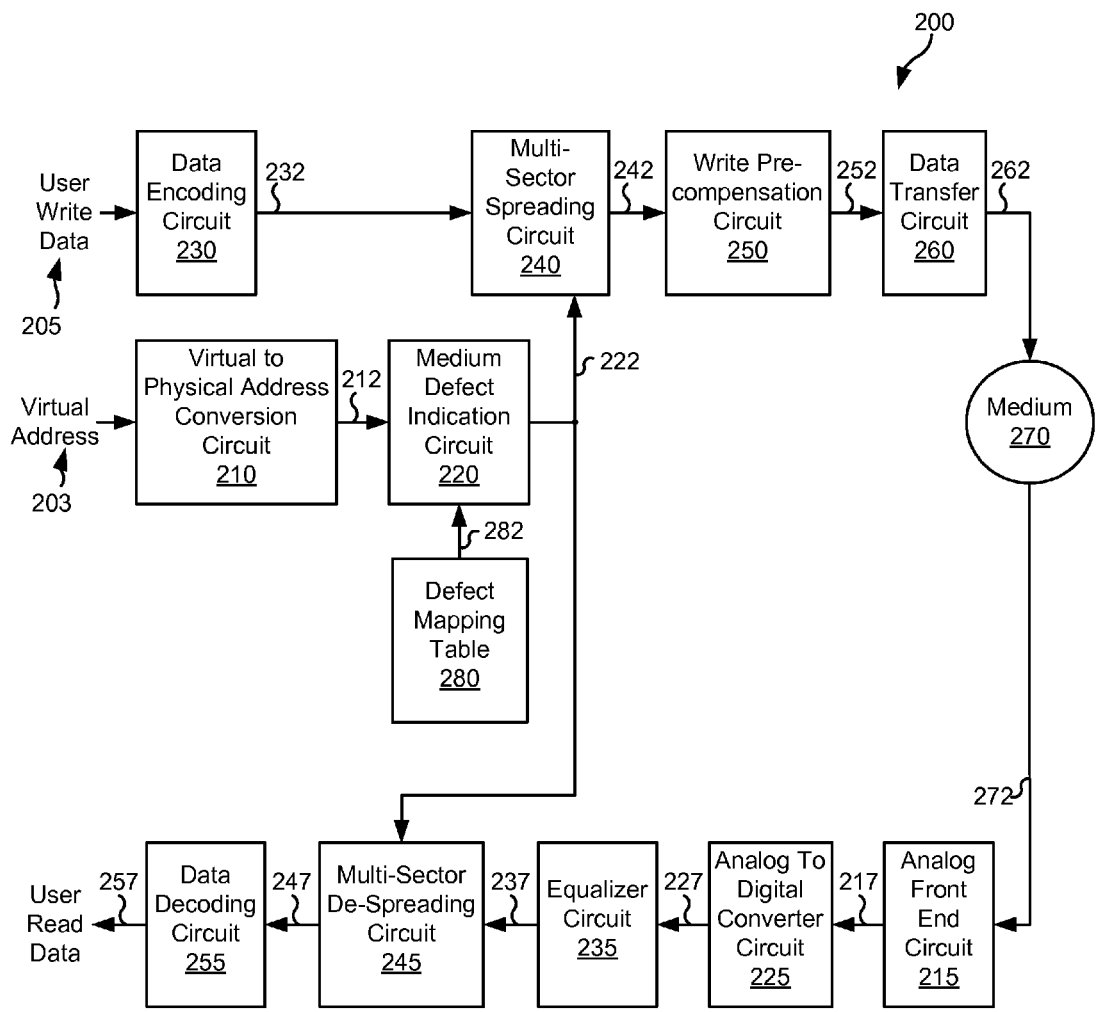
FIG. 2 shows a data transfer circuit including variable sector count spreading and de-spreading circuitry in accordance with one or more embodiments of the present invention.

Turning to FIG. 2, a data processing system 200 is shown that includes variable sector count spreading and de-spreading circuitry in accordance with some embodiments of the present invention. Data processing system 200 includes a data encoding circuit 230 that receives user write data 205 that is to be stored to a medium 270. Data encoding circuit 230 applies a data encoding algorithm to user write data 205 to yield a number of encoded data sets 232. The number of encoded data sets 232 corresponds to the amount of user write data to be encoded. Data encoding circuit 230 may be any circuit known in the art that is capable of encoding received data to yield corresponding encoded data sets. In one particular embodiment of the present invention, data encoding circuit 230 applies a low density parity check encoding algorithm. Based upon the disclosure provided herein, one of ordinary skill in the art will recognize other encoding algorithms that may be applied by data encoding circuit 230 in accordance with different embodiments of the present invention. In some embodiments of the present invention, medium 270 is a magnetic storage medium. In one or more cases, the magnetic storage medium is a disk platter. Based upon the disclosure provided herein, one of ordinary skill in the art will recognize a variety of storage mediums such as, for example, optical storage mediums that may be used in relation to different embodiments of the present invention.

Data processing system 200 further includes a virtual to physical address conversion circuit 210. A virtual address 203 is received along with user write data 205 indicating the location to which user write data 205 is to be stored. Virtual to physical address conversion circuit 210 is operable to convert the received virtual address to a physical address 212 on medium 270. Any circuit known in the art for converting between address spaces may be used to implement virtual to physical address conversion circuit 210. Physical address 212 is provided to a medium defect indication circuit 220 that is operable to compare physical address 212 to entries in a defect mapping table 280. Based upon the comparison, defect mapping table 280 provides a defect indicator 282 that identifies any defects within a block size of physical address 212, and the size of any such defects. The block address is the size of an interleaved data set 242 that is to be stored to medium 270. The identified defects and the size of those defects are provided as a defect indicator output 222. Defect mapping table 280 may be updated to include any defects on medium 270 identified either in an initial verification test or later during operation of medium 270. Any processes known in the art for identifying defects an mapping those defects may be used in relation to different embodiments of the present invention.

Defect indicator output 222 is provided to a multi-sector spreading circuit 240 and to a multi-sector de-spreading circuit 245. Multi-sector spreading circuit 240 includes three functional circuits: a sector number determination circuit (not shown), a segmenting circuit (not shown), and a spreading circuit (not shown). The aforementioned sector number determination circuit determines the numbed of encoded data sets 232 that are to be incorporated into interleaved data set 242. Where, for example, defect indicator output 222 does not indicate any defects, multi-sector spreading circuit 240 will determine that the number of encoded data sets 232 to be included in interleaved data set 242 is N. In some embodiments of the present invention, N is eight (8) and each of the encoded data sets is 4 KB. Based upon the disclosure provided herein, one of ordinary skill in the art will recognize a variety of value for N and/or size of encoded data sets that may be used in relation to different embodiments of the present invention. As another example, where defect indicator output 222 indicates a defect of a size that is less than or equal to the size of one of encoded data sets 232, multi-sector spreading circuit 240 will determine that the number of encoded data sets 232 to be included in interleaved data set 242 is N−1. As yet another example, where defect indicator output 222 indicates a defect of a size that is greater than the size of one of encoded data sets 232 and less than or equal to two times the size of one of encoded data sets 232, multi-sector spreading circuit 240 will determine that the number of encoded data sets 232 to be included in interleaved data set 242 is N−2. In general, multi-sector spreading circuit 240 determines the number to be N−(Integer)(Defect Size/Size of Encoded Data Set).

Figure 3A:
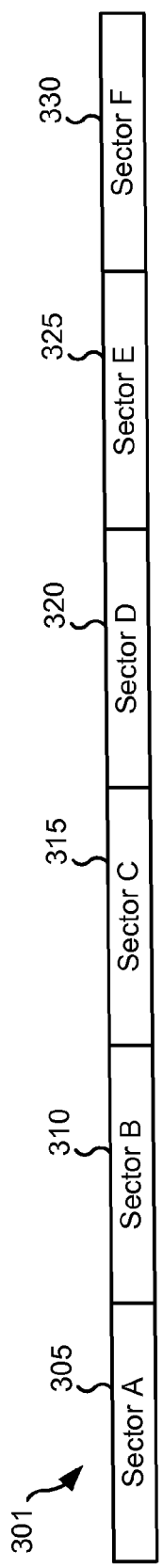
FIGS. 3a-3c shows phases of data spreading in accordance with one or more embodiments of the present invention where the region on a storage medium to be written does not include any defects.

Examples of determining the number of data sets to be included in interleaved data set 242 are shown in FIGS. 3a, 4a, 5a, respectively. As shown in FIG. 3a, where no defects are indicated by defect indicator output 222, an interim data set 301 includes six (in this example N=6) encoded data sets 305, 310, 315, 320, 325, 330 (labeled as Sector A, Sector B, Sector C, Sector D, Sector E, and Sector F, respectively) are to be combined in interleaved output 242. Alternatively, as shown in FIG. 4a, where a defect is indicated by defect indicator output 222 that is less than the size of one of the encoded data sets, an interim data set 401 includes five (i.e., in this example, N−1) encoded data sets 405, 410, 420, 425, 430 (labeled as Sector A, Sector B, Sector C, Sector D, and Sector E, respectively) are to be combined in interleaved output 242. Of note, an area 415 the size of one of the encoded data sets that surrounds a defective region 404 identified by defect indicator output 222 is not used. Of note, defective region 404 occur ring anywhere in area 415 results in recording the defect location and length and non-use of area 415. By reducing the amount of space used by the size of an encoded data set, the overall length of interim data set 401 is maintained the same as the overall length of interim data set 301 of FIG. 3a. As yet another example, as shown in FIG. 5a, where a defect is indicated by defect indicator output 222 that is greater than the size of one of the encoded data sets and less than or equal to the size of two times one of the encoded data sets, an interim data set 501 includes four (i.e., in this example, N−2) encoded data sets 505, 510, 525, 530 (labeled as Sector A, Sector B, Sector C, and Sector D, respectively) are to be combined in interleaved output 242. Of note, an area 515 and an area 520 the size of two of the encoded data sets that surrounds a defective region 504 identified by defect indicator output 222 is not used. Of note, defective region 504 occurring anywhere across area 515 and area 520 results in recording the defect location and length and non-use of area 515 and area 520. By reducing the amount of space used by the a multiple of the size of an encoded data set, the overall length of interim data set 501 is maintained the same as the overall length of interim data set 301 of FIG. 3a.

The aforementioned segmenting circuit of multi-sector spreading circuit 240 segments the determined number of encoded data sets to yield segmented data sets. In some embodiments of the present invention, encoded data sets are segmented into eight equal segments. Thus, for example, where the size of encoded data sets is 4 KB, each of the segments is 512B. Based upon the disclosure provided herein, one of ordinary skill in the art will recognize a variety of numbers of segments into which an encoded data set may be segmented, and a variety of different sizes for encoded data sets 232.

Figure 3B:
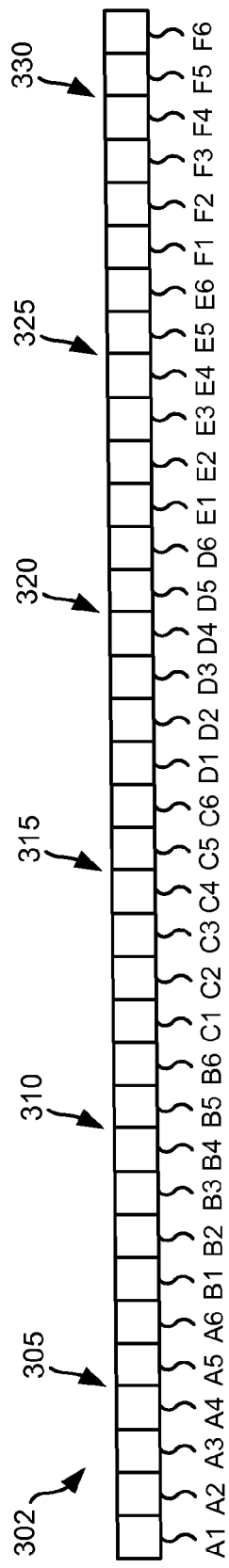

Examples of segmented encoded data sets are shown in FIGS. 3b, 4b, 5b, respectively. As shown in FIG. 3b, where no defects are indicated by defect indicator output 222, an interim data set 302 includes six (in this example N=6)

encoded data sets 305, 310, 315, 320, 325, 330 each segmented into six segments. In particular, encoded data set 305 is segmented into segments labeled A1, A2, A3, A4, A5, A6; encoded data set 310 is segmented into segments labeled B1, B2, B3, B4, B5, B6; encoded data set 315 is segmented into segments labeled C1, C2, C3, C4, C5, C6; encoded data set 320 is segmented into segments labeled D1, D2, D3, D4, D5, D6; encoded data set 325 is segmented into segments labeled E1, E2, E3, E4, E5, E6; and encoded data set 330 is segmented into segments labeled F1, F2, F3, F4, F5, F6.

Alternatively, as shown in FIG. 4b, where a defect is indicated by defect indicator output 222 that is less than the size of one of the encoded data sets, an interim data set 402 includes five (i.e., in this example, N−1) encoded data sets 405, 410, 420, 425, 430 each segmented into six segments. In particular, encoded data set 405 is segmented into segments labeled A1, A2, A3, A4, A5, A6; encoded data set 410 is segmented into segments labeled B1, B2, B3, B4, B5, B6; encoded data set 420 is segmented into segments labeled C1, C2, C3, C4, C5, C6; encoded data set 425 is segmented into segments labeled D1, D2, D3, D4, D5, D6; and encoded data set 430 is segmented into segments labeled E1, E2, E3, E4, E5, E6. Again, area 415 is not to be used and does not include data.

As yet another example, as shown in FIG. 5b, where a defect is indicated by defect indicator output 222 that is greater than the size of one of the encoded data sets and less than or equal to the size of two times one of the encoded data sets, an interim data set 502 includes four (i.e., in this example, N−2) encoded data sets 505, 510, 525, 530 each segmented into six segments. In particular, encoded data set 505 is segmented into segments labeled A1, A2, A3, A4, A5, A6; encoded data set 510 is segmented into segments labeled B1, B2, B3, B4, B5, B6; encoded data set 525 is segmented into segments labeled C1, C2, C3, C4, C5, C6; and encoded data set 530 is segmented into segments labeled D1, D2, D3, D4, D5, D6. Again, area 515 and area 520 are not to be used and do not include data.

The aforementioned spreading circuit of multi-sector spreading circuit 240 spreads the segments of encoded data sets 232 across interleaved data set 242 such that they are intermixed or interleaved with segments from different encoded data sets 232. Such an approach reduces the impact of any localized noise or defects on any given sector of data as only a segment or so of data from any given encoded data set is exposed to the particular localized noise or defect. In one particular embodiment of the present invention, where N encoded data sets are included in interleaved data set and each of the N encoded data sets is segmented into M segments, then interleaved output 242 includes the following series of data:

Segment$_{1,1}$; Segment$_{1,1}$ ... Segment$_{1,M}$ ... Segment$_{N,1}$; Segment$_{N,1}$ ... Segment$_{N,M}$.

Figure 3C:
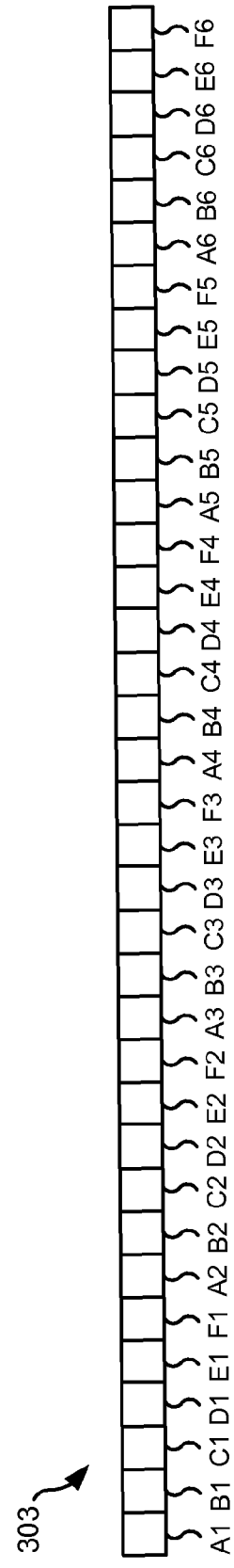

Examples of interleaved data sets are shown in FIGS. 3c, 4c, 5c, respectively. As shown in FIG. 3c, where no defects are indicated by defect indicator output 222, an interleaved data set 303 includes six (in this example N=6) encoded data sets with individual segments distributed across interleaved data set 303. As shown, the segments are arranged in the following order:

A1, B1, C1, D1, E1, F1, A2, B2, C2, D2, E2, F2 ... A6, B6, C6, D6, E6, F6.

As shown in FIG. 4c, where a defect is indicated by defect indicator output 222 that is less than the size of one of the encoded data sets, an interleaved output 403 includes five (i.e., in this example, N−1) encoded data sets with individual segments distributed across interleaved data set 403. As shown, the segments are arranged in the following order:

A1, B1, C1, D1, E1, A2, B2, C2, D2, E2 ... A6, B6, C6, D6, E6.

As shown in FIG. 5c, where a defect is indicated by defect indicator output 222 that is greater than the size of one of the encoded data sets and less than or equal to the size of two times one of the encoded data sets, an interleaved data set 503 includes four (i.e., in this example, N−2) encoded data sets with individual segments distributed across interleaved data set 503. As shown, the segments are arranged in the following order:

A1, B1, C1, D1, A2, B2, C2, D2 ... A6, B6, C6, D6.

Based upon the disclosure provided herein, one of ordinary skill in the art will recognize other interleaving schemes that may be used in relation to different embodiments of the present invention. Thus, as another example, where no defects are indicated by defect indicator output 222 where an interleaved output includes six encoded data sets the segments may be arranged in the following order:

A1, B2, C3, D4, E5, F6, B1, C2, D3, E4, F5, A6, C1, D2, E3, F4, A5, B6, D1, E2, F3, A4, B5, C6, E1, F2, A3, B4, C5, D6, F1, A2, B3, C4, D5, E6.

As another example, where a defect is indicated by defect indicator output 222 that is less than the size of one of the encoded data sets where an interleaved output includes five encoded data sets the segments may be arranged in the following order:

A1, B2, C3, D4, E5, A6, B1, C2, D3, E4, A5, B6, C1, D2, E3, A4, B5, C6, D1, E2, A3, B4, C5, D6, E1, A2, B3, C4, D5, E6.

As yet another example, where a defect is indicated by defect indicator output 222 that is greater than the size of one of the encoded data sets and less than or equal to the size of two times one of the encoded data sets where an interleaved output includes four encoded data sets the segments may be arranged in the following order:

A1, B2, C3, D4, A5, B6, B1, C2, D3, A4, B5, C6, C1, D2, A3, B4, C5, D6, D1, A2, B3, C4, D5, A6.

Interleaved data set 242 is provided to a write pre-compensation circuit 250 that may be any circuit known in the art that is capable of modifying or arranging interleaved data set 242 in a format and/or domain suitable for transfer via a transfer medium (not shown). Write pre-compensation circuit 250 generates a compensated output 252 that is provided to a write driver circuit 260. Write driver circuit 260 may be any circuit capable of providing the received information to medium 270 as a data output 262.

When data is to be read back from medium 270, it is received as sensed information 272 that is provided to an analog front end circuit 215. Analog front end circuit 215 includes circuitry for processing sensed information 272 into analog data 217. In some embodiments of the present invention, analog front end circuit 215 includes a preamplifier circuit, a variable gain amplifier circuit, and/or an analog filter circuit. Based upon the disclosure provided herein, one of ordinary skill in the art will recognize a variety of circuitry that may be included in analog front end circuit 215. Analog data 217 is provided to analog to digital converter circuit 225 where it is converted into a series of digital samples 227.

Analog to digital converter circuit 225 may be any circuit known in the art that is capable of producing digital samples corresponding to an analog input signal. Based upon the disclosure provided herein, one of ordinary skill in the art will recognize a variety of analog to digital converter circuits that may be used in relation to different embodiments of the present invention. Digital samples 227 are provided to an equalizer circuit 235. Equalizer circuit 235 applies an equalization algorithm to digital samples 227 to yield an equalized output 237. In some embodiments of the present invention, equalizer circuit 235 is a digital finite impulse response filter circuit as are known in the art.

Equalized output 237 is provided to a multi-sector de-spreading circuit 245. Multi-sector de-spreading circuit 245 reverses the processes of multi-sector spreading circuit 240 described above. Multi-sector de-spreading circuit 245 includes two functional circuits: a sector number determination circuit (not shown), and a de-spreading circuit (not shown). The aforementioned sector number determination circuit determines the numbed of encoded data sets 232 that are expected in equalized output 237 (i.e., the number of encoded data sets originally included in interleaved data set 242). This determination is based upon virtual address 203 that corresponds to a read address provided along with a read request requesting access to sensed information 272 from medium 270. Virtual address 203 is converted to defect indicator output 222 as described above. Where, for example, defect indicator output 222 does not indicate any defects, multi-sector de-spreading circuit 245 will determine that the number of expected encoded data sets 232 to be included in equalized output 237 is N. As another example, where defect indicator output 222 indicates a defect of a size that is less than or equal to the size of one of encoded data sets 232, multi-sector de-spreading circuit 245 will determine that the number of encoded data sets 232 expected in equalized output 237 is N–1. As yet another example, where defect indicator output 222 indicates a defect of a size that is greater than the size of one of encoded data sets 232 and less than or equal to two times the size of one of encoded data sets 232, multi-sector de-spreading circuit 245 will determine that the number of encoded data sets 232 expected in equalized output 237 N–2. In general, multi-sector de-spreading circuit 245 determines the number to be N–(Integer)(Defect Size/Size of Encoded Data Set). Similar to that discussed above, FIGS. 3a, 4a, 5a are examples of determining the number of data sets expected in equalized output 237.

The aforementioned de-spreading circuit of multi-sector de-spreading circuit 245 reverses the spreading originally applied by multi-sector spreading circuit 240. This process reassembles the respective segments into the original encoded data sets. This process is represented by changing from the data sets of FIGS. 3c, 4c, 5c to the data sets of FIGS. 3b, 4b, 5b, respectively. The resulting reassembled encoded data sets 247 are provided to a data decoding circuit 255. Data decoding circuit 255 reverses the encoding originally applied by data encoding circuit 230. In some embodiments of the present invention, data decoding circuit 255 includes both a data detector circuit and a data decoding circuit as is known in the art. Where the data encoding algorithm is a low density parity check algorithm, then the data decoding algorithm applied by data decoding circuit is a low density parity check decode algorithm. Based upon the disclosure provided herein, one of ordinary skill in the art will recognize a variety of data decoding algorithms that may be used in relation to different embodiments of the present invention. When all of the errors in reassembled encoded data sets 247 are resolved, the results are provided as user read data 257.

Figure 6:
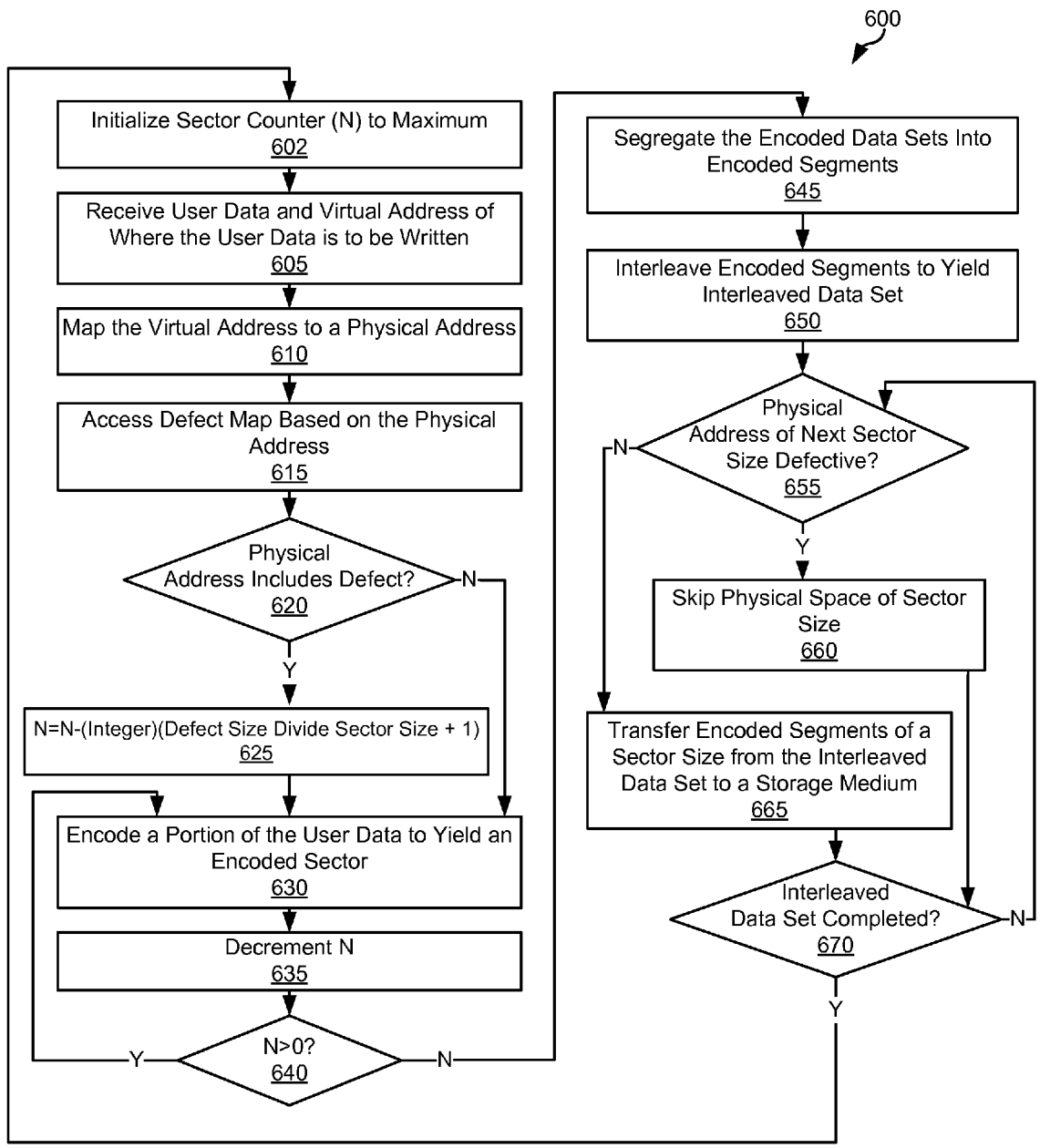
FIG. 6 is a flow diagram showing a method in accordance with some embodiments of the present invention for data spreading during a write process.

Turning to FIG. 6, a flow diagram 600 shows a method in accordance with some embodiments of the present invention for data spreading during a write process. Following flow diagram 600, a sector counter (N) is initialized to a maximum (block 602). User data is received along with a virtual address of where the physical data is to be written (block 605). The virtual address is mapped to a physical address on the medium to which the data is to be written (block 610). This physical address is then used to access a defect map (block 615). The defect map provides an indication of locations on the storage medium that have been identified as defective, and the size of the defective region. It is determined whether there are any defects in the area of the storage medium to which the user data is to be stored (block 620). Where defects are indicated in the region to be written by the user data (block 620), the sector counter (N) is modified to reflect the unusable areas in the region to be written (block 625). In particular, where a defective region smaller than a sector of data is identified, the sector counter is decremented by one. Where a defective region greater than a sector of data and less than two sectors of data is identified, the sector counter is decremented by two. This continues as more defects are found in the region to be written or where the defects are larger. In general, the sector counter is modified in accordance with the following equation:

$$N = N - \text{ceiling}[\text{Defect Size}/\text{Sector Size}],$$

where "Defect Size" is the size of the identified defective region, and "Sector Size" is the size of one sector of encoded data.

Where either no defects are found (block 620) or the sector counter has been modified (block 625), a portion of the user data of a size corresponding to a sector of data is encoded to yield an encoded sector (block 630). Such encoding may be, but is not limited to, low density parity check encoding as is known in the art. The sector counter (N) is then decremented (block 635), and it is determined whether the sector counter (N) is still greater than zero (block 640). where the sector counter is still greater than zero (block 640), the processes of blocks 630-640 are repeated for the next sector of data.

Alternatively, where the sector counter is not greater than zero (block 640), each of the encoded data sets are segregated into encoded segments (block 645). This may be done similar to that shown in FIGS. 3b, 4b, 5b discussed above. In some embodiments of the present invention, the encoded segments are 512B. In other embodiments of the present invention, the encoded segments are 256B. Based upon the disclosure provided herein, one of ordinary skill in the art will recognize a variety of segment sizes that may be used in relation to different embodiments of the present invention. The encoded segments are then interleaved such that the impact of any channel noise is spread across multiple sectors of data rather than being localized in a single sector. This interleaving may be done similar to that discussed above in relation to FIGS. 3c, 4c, 5c.

It is then determined if the next region (i.e., a full sector size) on the storage medium to which the data is to be written is defective (block 655). Where the next region of the sector size is not defective (block 655), the next encoded segments of the sector size are transferred to the storage medium (block 665). Alternatively, where the next region of the sector size is defective (block 655), that region is skipped (block 660). It is then determined whether all of the entire interleaved codeword has been transferred to the storage medium (block 670). Where the entire interleaved codeword has been transferred (block 670), the process ends. Otherwise, where the entire interleaved codeword has not been transferred (block 670) the processed of blocks 655-670 are repeated for the next portion of the interleaved codeword of the sector size.

Figure 7:
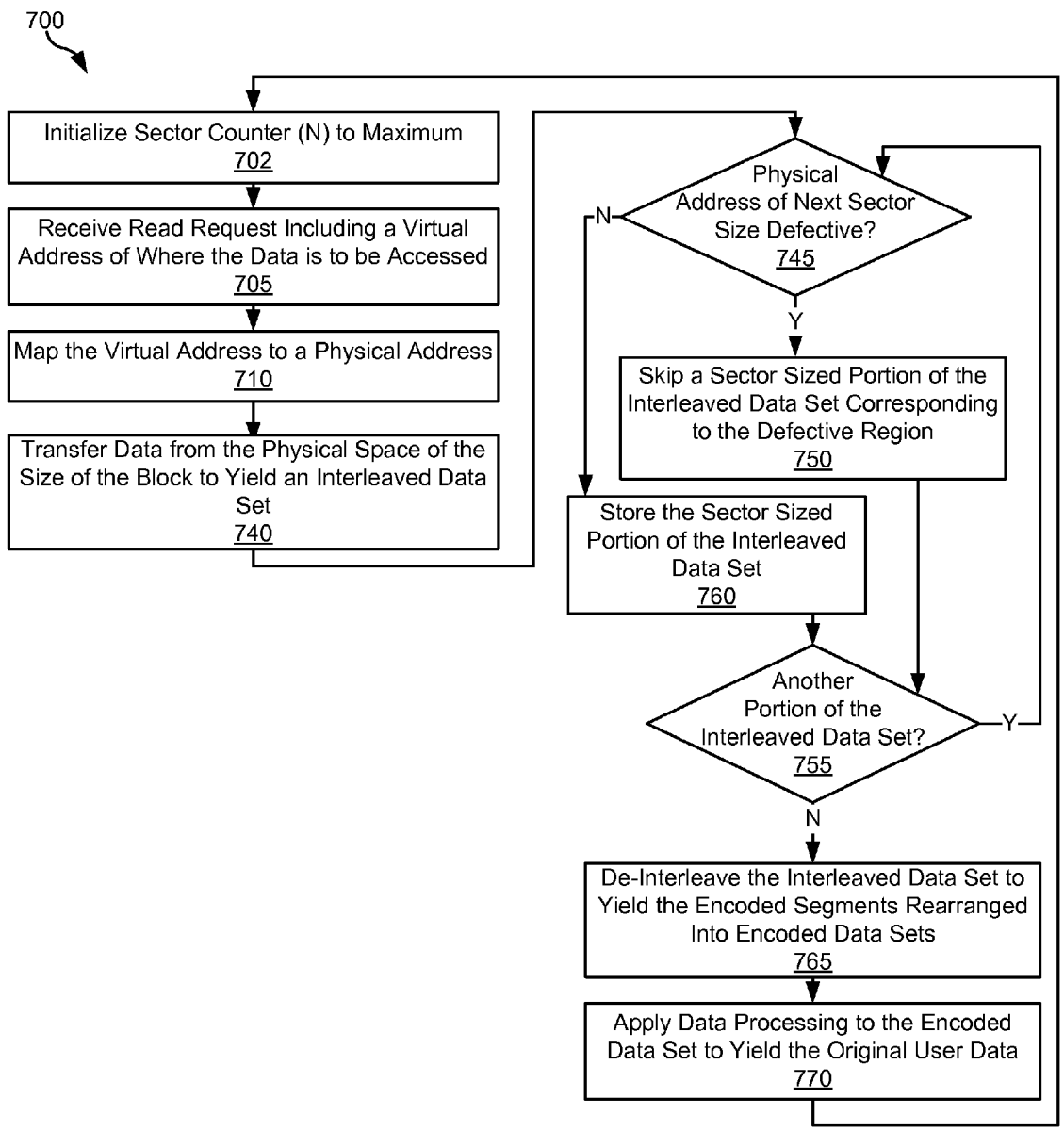
FIG. 7 is a flow diagram showing a method in accordance with some embodiments of the present invention for data de-spreading during a read process.

Turning to FIG. 7, a flow diagram 700 shows a method in accordance with some embodiments of the present invention for data de-spreading during a read process. Following flow diagram 700, a sector counter (N) is initialized to a maximum (block 702). A read request is received that indicates a virtual address from which a block of data on the storage device is to be accessed (block 705). The virtual address is mapped to a physical address on the medium to which the data is to be written (block 710). A data block beginning at the physical address is accessed from the storage medium as an interleaved data set (block 740). Such interleaved data sets may be similar to those discussed above in relation to FIGS. 3c, 4c, 5c.

It is then determined if the next region (i.e., a full sector size) of the interleaved data set was derived from a defective region on the storage medium (block 745). Where the next region of the interleaved data set was not derived from a defective region on the storage medium (block 745), the next region is stored as a sector sized portion of the interleaved data set (block 760) Alternatively, where the next region was derived from a defective region on the storage medium (block 745), that region is skipped (block 750).

It is determined whether another portion of the interleaved data set remains to be processed (block 755). Where another portion remains to be processed (block 755), the processes of blocks 745-755 are repeated for the next portion.

Where no additional portions remain to be processed (block 755), the saved portions of the interleaved data set are de-interleaved to yield encoded segments rearranged into encoded data sets (block 765). These encoded data sets may be similar to those discussed above in relation to FIGS. 3b, 4b, 5b. Data processing is then applied to the encoded data sets to recover original user data (block 770). This data processing may include, but is not limited to, application of both data detection and data decoding algorithms as are known in the art.

It should be noted that the various blocks discussed in the above application may be implemented in integrated circuits along with other functionality. Such integrated circuits may include all of the functions of a given block, system or circuit, or a subset of the block, system or circuit. Further, elements of the blocks, systems or circuits may be implemented across multiple integrated circuits. Such integrated circuits may be any type of integrated circuit known in the art including, but are not limited to, a monolithic integrated circuit, a flip chip integrated circuit, a multichip module integrated circuit, and/or a mixed signal integrated circuit. It should also be noted that various functions of the blocks, systems or circuits discussed herein may be implemented in either software or firmware. In some such cases, the entire system, block or circuit may be implemented using its software or firmware equivalent. In other cases, the one part of a given system, block or circuit may be implemented in software or firmware, while other parts are implemented in hardware.

In conclusion, the invention provides novel systems, devices, methods and arrangements for out of order data processing. While detailed descriptions of one or more embodiments of the invention have been given above, various alternatives, modifications, and equivalents will be apparent to those skilled in the art without varying from the spirit of the invention. Therefore, the above description should not be taken as limiting the scope of the invention, which is defined by the appended claims.

What is claimed is:

1. A data processing system, the data processing system comprising:
   a data encoding circuit operable to:
      select a number of sector sized encoded data sets for inclusion in an interleaved data set based upon an identified defect on a storage medium; and
      shuffle segments of the selected number of encoded data sets to yield the interleaved data set.

2. The system of claim 1, wherein the size of each of the encoded data sets is a sector size, wherein a size of the identified defect on the storage medium is less than the sector size, and wherein the system further comprises a data write circuit operable to write the interleaved data set to the storage medium such that a sector sized region on the storage medium corresponding to the identified defect does not store any information corresponding to any of the encoded data sets.

3. The system of claim 1, wherein the size of each of the encoded data sets is a sector size, wherein a size of the identified defect on the storage medium is greater than the sector size and less than two times the sector size, and wherein the system further comprises a data write circuit operable to write the interleaved data set to the storage medium such that a region of two times the sector size on the storage medium corresponding to the identified defect does not store any information corresponding to any of the encoded data sets.

4. The system of claim 1, wherein a number of encoded data sets included in an interleaved data set varies as a function of a number of defects and the size of those defects on the storage medium.

5. The system of claim 1, wherein the system further comprises:
   a defect location determination circuit operable to indicate the identified defect on the storage medium based at least in part on a write address.

6. The system of claim 1, wherein the system is implemented as part of a storage device, and wherein the storage device includes the storage medium.

7. The system of claim 6, wherein the storage medium is a magnetic storage medium.

8. The system of claim 1, wherein the size of each of the encoded data sets is a sector size, and wherein the segments are one half or less of the sector size.

9. The system of claim 1, wherein the data encoding circuit includes a low density parity check encoder circuit operable to encode a user data set to yield the encoded data sets.

10. The system of claim 1, wherein the system further comprises:
    a data read circuit operable to:
       identify valid portions of data written to the storage medium based at least in part on the identified defect on a storage medium to yield a read data set; and
       de-shuffle the read data set to yield the encoded data sets.

11. The system of claim 10, wherein the system further comprises:
    a data processing circuit operable to process the encoded data sets to yield corresponding original data sets.

12. The data processing system of claim 1, wherein the system is implemented as an integrated circuit.

13. A method for data processing, the method comprising:
    receiving a user data set;
    encoding portions of the user data set using a data encoder circuit to yield encoded data sets, wherein each of the encoded data sets are of a sector size;
    selecting a number of sector sized encoded data sets for inclusion in an interleaved data set based upon an identified defect on a storage medium; and
    shuffling segments of the selected number of encoded data sets to yield the interleaved data set.

14. The method of claim 13, wherein the method further comprises:
    using a defect location determination circuit to indicate the identified defect on the storage medium based at least in part on a write address.

15. A data processing system, the data processing system comprising:

a means for data encoding to:
- select a number of sector sized encoded data sets for inclusion in an interleaved data set based upon an identified defect on a storage medium; and
- shuffle segments of the selected number of encoded data sets to yield the interleaved data set.

16. The system of claim 15, wherein the size of each of the encoded data sets is a sector size, wherein a size of the identified defect on the storage medium is less than the sector size, and wherein the system further comprises:
- a data write circuit operable to write the interleaved data set to the storage medium such that a sector sized region on the storage medium corresponding to the identified defect does not store any information corresponding to any of the encoded data sets.

17. The system of claim 15, wherein the size of each of the encoded data sets is a sector size, wherein a size of the identified defect on the storage medium is greater than the sector size and less than two times the sector size, and wherein the system further comprises:
- a data write circuit operable to write the interleaved data set to the storage medium such that a region of two times the sector size on the storage medium corresponding to the identified defect does not store any information corresponding to any of the encoded data sets.

18. The system of claim 15, wherein a number of encoded data sets included in an interleaved data set varies as a function of a number of defects and the size of those defects on the storage medium.

19. The system of claim 15, wherein the system further comprises:
- a means for determining defect location to indicate the identified defect on the storage medium based at least in part on a write address.

20. The system of claim 15, wherein the size of each of the encoded data sets is a sector size, and wherein the segments are one half or less of the sector size.

* * * * *